(12) United States Patent
Edelstein et al.

(10) Patent No.: US 6,784,088 B2
(45) Date of Patent: Aug. 31, 2004

(54) METHOD TO SELECTIVELY CAP INTERCONNECTS WITH INDIUM OR TIN BRONZES AND/OR OXIDES THEREOF AND THE INTERCONNECT SO CAPPED

(75) Inventors: Daniel C. Edelstein, White Plains, NY (US); Sung Kwon Kang, Chappaqua, NY (US); Maurice McGlashan-Powell, Yorktown Heights, NY (US); Eugene J. O'Sullivan, Nyack, NY (US); George F. Walker, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 32 days.

(21) Appl. No.: 10/345,288

(22) Filed: Jan. 16, 2003

(65) Prior Publication Data

US 2003/0104120 A1 Jun. 5, 2003

Related U.S. Application Data

(62) Division of application No. 09/706,820, filed on Nov. 7, 2000, now Pat. No. 6,551,931.

(51) Int. Cl.⁷ .............................................. H01L 21/44
(52) U.S. Cl. ...................... 438/612; 438/613; 438/614; 438/637; 438/638; 438/666; 438/678; 438/679; 438/686; 438/687

(58) Field of Search ................................. 438/612–614, 438/637–638, 666, 678–679, 686–687

(56) References Cited

U.S. PATENT DOCUMENTS

| | | |
|---|---|---|
| 2,282,511 A | 5/1942 | Bradley et al. |
| 2,891,871 A | 6/1959 | Ceresa et al. |
| 3,303,029 A | 2/1967 | Shipley |
| 4,657,632 A | 4/1987 | Holtzman et al. |
| 4,715,894 A | 12/1987 | Holtzman et al. |
| 5,196,053 A | 3/1993 | Dodd et al. |
| 5,203,911 A | 4/1993 | Sricharoenchaikit et al. |
| 5,217,751 A | 6/1993 | King et al. |
| 5,364,459 A | 11/1994 | Senda et al. |
| 5,554,211 A | 9/1996 | Bokisa et al. |
| 5,614,003 A | 3/1997 | Mallory, Jr. |
| 5,872,404 A | 2/1999 | Lynch et al. |
| 6,335,104 B1 * | 1/2002 | Sambucetti et al. ........ 428/615 |
| 6,391,773 B2 * | 5/2002 | Andricacos et al. ........ 438/678 |
| 6,503,834 B1 * | 1/2003 | Chen et al. ................. 438/687 |

* cited by examiner

*Primary Examiner*—Lynne Gurley
(74) *Attorney, Agent, or Firm*—Robert M. Trepp, Esq.; Connolly Bove Lodge & Hutz

(57) ABSTRACT

A method to selectively cap a cooper BEOL terminal pad with a Cu/Sn/Au alloy. The method includes providing one or more Cu BEOL terminal pads and coating the pads with a Sn coating followed by coating the Sn with a Au coating. The coated pads are then annealed to form the Cu/Sn/Au capping alloy.

10 Claims, 10 Drawing Sheets

METHOD TO SELECTIVELY CAP INTERCONNECTS WITH INDIUM OR TIN BRONZES AND/OR OXIDES THEREOF AND THE INTERCONNECT SO CAPPED

This application is a divisional of U.S. patent application No. 09/706,820, filed Nov. 7, 2000, now U.S. Pat. No. 6,551,931.

FIELD OF THE INVENTION

The present invention relates generally to the specifically directed plating of indium and tin bronzes on copper structures, and particularly, but not by way of limitation, to coating the top surface of semiconductor interconnects with an indium, or tin bronze or an oxide thereof. The invention also relates to the interconnect so formed.

BACKGROUND

It is desirable to selectively cap copper interconnects with an alloy coating to provide improved adhesion, electromigration resistance, redundant current-strapping, improved via contact resistance, robustness, and corrosion protection. The capping must be highly selective, specifically plating only the copper wiring, so as not to require expensive and critical lithography and etching to define the cap over the interconnect and to remove it from the spaces between interconnects. Cu on-chip contacts (e.g. wire bond or C4 pads) need similar capping for robust, corrosion-resistant terminal metallurgical contact. Previously, this problem has been addressed by electroless or alloy-formed selective capping (e.g. by electroless CoP/Au, NiP/Au, or PVD-deposited In or Sn with alloying reactions to the Cu) followed by selective wet-etching. These solutions are subject to shorting across very finely-spaced interconnects. A selective process which solves this problem is the immersion (autocatalytic exchange) replacement of Cu surface atoms with Sn or other species. The Cu/Sn/O system is resistant to oxidation only to ~300° C. The Cu/In/O system of the invention is more highly resistant, with stability extending to temperatures in excess of 400° C.

In immersion (or chemical displacement) coating, the substrate, usually a metal, is coated with a film (usually metallic) from a solution that contains the coating material in ionic form. The immersion coating process does not require a separate reducing agent as in electroless or auto catalytic deposition, or electric current as in electroplating. Rather, the substrate metal acts as the reducing agent, for example as when iron (Fe) is immersed in a copper sulfate solution:

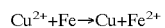

Here, Fe supplies electrons to the Cu ions, reducing them to zerovalent Cu, which coats the Fe substrate. The resultant $Fe^{2+}$ ions dissolve into solution. The deposition of Cu and Fe is straightforward in that the standard electrochemical potential for $Cu/Cu^{2+}$ couple (0.34 V vs. the normal hydrogen electrode) is greater than that of the $Fe/Fe^{2+}$ (−0.44 V vs. the normal hydrogen electrode); since Cu is more "noble", or thermodynamically "inert" with respect to Fe, it may be said to have a greater driving force than Fe for residing in an zerovalent state. Thus, when uncomplexed $Cu^{2+}$ ions encounter Fe metal, the $Cu^{2+}$ ions spontaneously oxidize the Fe to $Fe^{2+}$ forming zerovalent Cu, which remains on the Fe surface as a film.

The deposit thickness obtained by immersion coating is limited, since the coating metal covers the base substrate, thereby preventing access of the coating ions in solution ($Cu^{2+}$ ions in solution), and removal of the base substrate product ions ($Fe^{2+}$ in our example). Typically, coating thicknesses are in the range of 10–1000 mm.

Relatively few metals can be deposited by an immersion process, mainly because of standard potential mismatch. A well-known example is immersion deposition of tin on copper (e.g., U.S. Pat. No. 2,282,511). However, the standard potential of $Sn/Sn^{2+}$ (−0.137 V vs. the normal hydrogen electrode, NHE) is less than either the $Cu/Cu^{2+}$ (0.34 V vs. NHE) or the $Cu/Cu^{+}$ (0.51 V), indicating that Cu would tend to immersion deposit on Sn, but not Sn on Cu. Nevertheless bat complexing the $Cu^{+}$ ions in solution with a complexant such as cyanide or thiourea (often known as thiocarbamide), one can lower the standard potential of the $Cu/Cu^{+}$ couple below that of $Sn/Sn^{2+}$. Thus, Sn now has a spontaneous tendency to immersion deposit on Cu.

The standard potential of the $In/In^{3+}$ couple is −0.34 V(NHE), and −0.126 V (NHE) for $In/In^{+}$. However, the only stable In ion in aqueous solutions is $In_{3+}$. The $In/In^{3+}$ couple potential (−0.34 V (NHE)) is ca. 0.2 V more negative than the of $Sn/Sn^{2+}$ (−0.137 V (NHE)), which indicates that In should be more difficult than Sn to deposit on Cu by an immersion process from solution. Immersion and/or electroless plating baths are known in the art. Bokisa et al. (U.S. Pat. No. 5,554,211) describe one such bath that differs from the present invention in that it specifically does not contain thiourea and whereas the bath of the present invention contains sulfuric acid, Bokissa et al. recite the use of fluoboric and alkane or alkanol sulfonic acids. Sricharoenchaikit et al. (U.S. Pat. No. 5,203,911) specifically require the use of low metal ion concentrations from 1 to 10 millimolar, whereas the present invention operates in the range of from about 65 to about 200 millimolar. The reference specifically recites the disadvantages of hypophosphite and alkali metals, both of which are recited in the present invention. The chemical displacement solution of King et al. (U.S. Pat. No. 5,217,751) requires, in addition to an ionic solution of the plating metal, the presence of a source of the free metal in contact with the solution. This is a disadvantage not present in the present invention. Holtzman et al. (U.S. Pat. No. 4,715,894) describe a chemical displacement composition suitable for the deposition of a layer of tin or indium. The plating solution of Senda et al. (U.S. Pat. No. 5,364,459) requires titanium salts many of which are regulated by the Toxic Substances Control Act and are likely to present disposal issues. However, each of these described systems is limited to plating a layer of metal. The problem of plating a layer of alloy was not addressed by the prior art.

As the standard and best known method for fabricating Cu interconnects is the Damascene or dual-Damascene process with electroplated Cu fill, this leaves Cu interconnects encapsulated on three sides with a refractory liner, but exposed on the top surfaces after chemical-mechanical planarization. If the top surface could also be capped with a highly adhesive, corrosion-resistant metal, then reliability would be improved, and as well there would be more freedom in the choices for subsequent processing steps, which might attack or corrode exposed Cu and could not be used in the uncapped case. It is thus desirable to selectively cap Cu interconnects with indium or tin bronze or oxides and to provide a method of controllably and selectively depositing the In or Sn bronze in very thin layers only on the exposed surfaces of Cu interconnects. Such undesired coating on the insulating surfaces between the interconnects would lead to unwanted electrical shorts. To eliminate these shorts, either an additional masking step and etching, or a selective etching step without masking would be required to removed this undesired In or Sn coating.

Due to the existence and commercial availability of an immersion Sn plating bath for Cu, the immersion-plated Cu/Sn/Au ternary system is known, and was studied here specifically for the new application of terminal wire bond metallurgy on Cu interconnects. The Au is necessary to prevent native Sn oxides from preventing good wire bonding by the thermal/ultrasonic ball-bonding or wedge-bonding techniques. The Cu—Sn—Au ternary compound layer has been investigated as a protective layer covering Cu interconnects for wire bonding, and for probe damage resistance, oxidation resistance, and as a Cu diffusion barrier. The proposed compound layer is formed by selective immersion Sn coating on Cu terminal pads formed by the Damascene process during the normal course of Cu interconnect fabrication, followed by immersion (and/or electroless) Au coating and appropriate annealing steps. RBS analysis has been used to follow the reaction products of the ternary system. The initial thickness of Sn and Au layers investigated ranges from a few tens to a few thousands of angstroms. Gold wire bonding evaluation on the Au—Sn—Cu ternary was promising. A diffusion barrier experiment performed at 400° C., in forming gas did also yield an encouraging result. However, RBS (FIG. 4) and Auger (FIG. 5) data after subsequent aggressive corrosion stressing indicated that the system allows Cu penetration through the alloy and Sn oxide to the surface, for sustained temperatures above approximately 300–350° C. This result is consistent with published studies (D. N. Wang, A. C. Miller, and M. R. Notis, "XPS Study of the Oxidation Behavior of the $Cu_3Sn$ Intermetallic Compound at Low Temperatures" Surface and Interface Analysis, 24, 127 (1996)) of Cu(Sn) alloy thin films. Thus the Cu(Sn, O) system may be applicable for many types of chips or packages with Cu thin film wiring, but might be unsuitable for capping Cu interconnects in the more aggressive processing technologies, where temperature cycling to approximately 400° C. is routinely employed during the fabrication process.

SUMMARY OF INVENTION

A method is provided for forming a coating of indium or tin on copper or aluminum substrates and in particular the method provides that the indium or tin is deposited on the copper surfaces and not silicon or insulator surfaces.

The invention also provides layers of indium or tin bronzes as barriers to the electromigration of copper. The method also attains oxides of those bronzes that act to prevent uncontrolled growth of copper corrosion products.

In one embodiment of the invention a copper substrate having at least one exposed Cu surface is immersed in a deposition bath containing the ionic form of a plating metal. According to aspects of the invention, the ion, $In^{3+}$, or $Sn^{2+}$, is chelated by a complexing agent such as thiourea. When the copper substrate is immersed, a selective autocatalytic process commences whereby an indium or tin coating is grown on the copper substrate. According to some aspects of the invention, the thickness of the film is controlled by the autocatalytic nature of the process to be no thicker than about 1000 angstroms, in other embodiments, lesser thicknesses are achieved by control of the immersion time. Subsequent annealing in an inert or reducing ambient, or in an oxidizing ambient, respectively forms Cu alloys (i.e., bronzes) and oxides.

According to some embodiments of the invention, the copper substrate is a Cu-damascene (or dual damascene) interconnect, fabricated through the CMP planarization step, leaving an exposed upper surface. In other embodiments, the interconnect is formed such that top and side surfaces are exposed. In further embodiments of the invention, the copper substrate is a Cu on chip contact, such as a wire bond pad or a C4 pad.

The invention further provides autocatalytic baths, and compositions therefore, useful for the electroless plating of indium or tin on exposed copper or aluminum surfaces.

Still other objects and advantages of the present invention will become readily apparent by those skilled in the art from the following detailed description, wherein it is shown and described preferred embodiments of the invention, simply by way of illustration of the best mode contemplated of carrying out the invention. As will be realized the invention is capable of other and different embodiments, and its several details are capable of modifications in various obvious respects, without departing from the invention. Specifically, the invention is herein described in terms of the semiconductor field, but nothing inherent to the invention so limits it. It is understood that the invention will have application in various of the other arts. Moreover, the description is in terms of certain selected devices within the semiconductor arts, but the invention is not limited to such devices. Accordingly, the description is to be regarded as illustrative in nature and not as restrictive.

BRIEF DESCRIPTION OF DRAWINGS

The foregoing and other objects, features and advantages of the invention will be apparent from the following more particular description of preferred embodiments of the invention as illustrated in the accompanying drawings in which:

FIG. 2. Resistance of Cu capped with varying thicknesses of In;

DETAILED DESCRIPTION OF INVENTION.

Figure 7A:
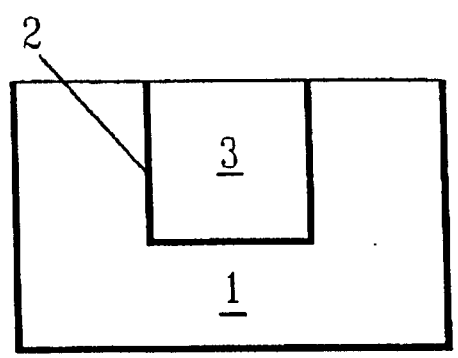
FIG. 7. Structure and process sequence of present invention.
Figure 7B:
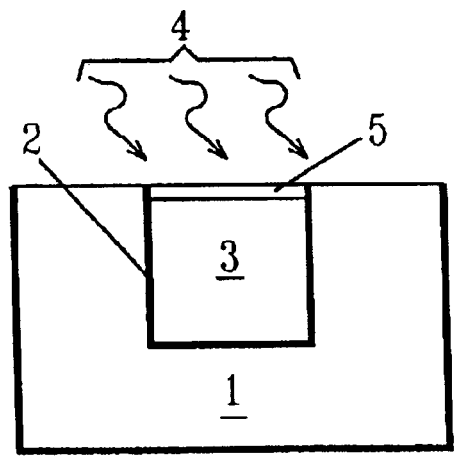
Figure 7C:
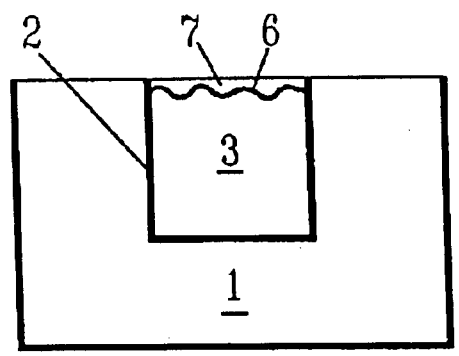

Reference is made to the figures to illustrate selected embodiments and preferred modes of carrying out the invention. It is to be understood that the invention is not hereby limited to those aspects depicted in the figures. One embodiment of the invention can be understood with reference to FIG. 7 which schematically depicts the process sequence of the present invention. Shown is an interconnect provided by a standard damascene, or dual damascene fabrication process with electroplated Cu fill 3, where 1 is a $SiO_2$ or other appropriate substrate and 2 is a liner. See Edelstein et al., "Full Copper Wiring in Sub-0.25 μm CMOS Technology", Tech. Digest IEEE Int. Electron Devices Mtg., 776 (1997) disclosure of which is herein incorporated by reference. At the stage following CMP planarization, the Cu interconnects are encapsulated on three sides by a refractory liner, but the upper surface is exposed. Subsequent processing steps that attack or corrode Cu may not be used. Were a refractory cap to be provided, increased design freedom to use such Cu incompatible steps would again be permitted. Moreover, the highly adherent, corrosion resistant In or Sn caps provide increased reliability.

The interconnect is placed in an immersion deposition bath containing ionic indium or tin, indicated as arrows 4. The bath contains water and an indium or tin salt, typically from about 8 to about 25 g/l $InCl_3$ or from about 2 to 20 g/l $SnCl_2$. The bath further contains a complexing agent, typically from about 40 to about 80 g/l thiourea. Reference to thiourea is intended to refer to the thiourea kernel as well as to any of the various thiourea derivatives, homologues, or analogues disclosed by Holtzman et al. (U.S. Pat. No. 2,891,871 and 4, 715, 894) which is incorporated herein by reference." A reducing agent is included to minimize pitting of the copper surfaces. Such reducing agent may be any of the hypophosphite salts and is typically present at from about 2 to about 50 g/l. In addition, the bath contains sulfuric acid at from about 8 to about 30 milliliters/liter.

The In or Sn ions contact the zerovalent Cu surface and are thereby reduced to a zerovalent metal film layer 5 over the Cu surface. If allowed to proceed to completion, the reaction will terminate where the film layer achieves a thickness of about 1000 Å (angstroms) because the solvated ions are prevented from contacting the copper surface. Moreover, because it is the copper metal itself that acts as the reducing agent, In or Sn plate selectively plate the exposed Cu surfaces, and do not plate exposed insulator between the Cu surfaces. It is also preferred that a second reducing agent, for example, a hypophosphite salt be included in the composition. A function of this is to minimize potential pitting of the Cu surface.

Figure 1:
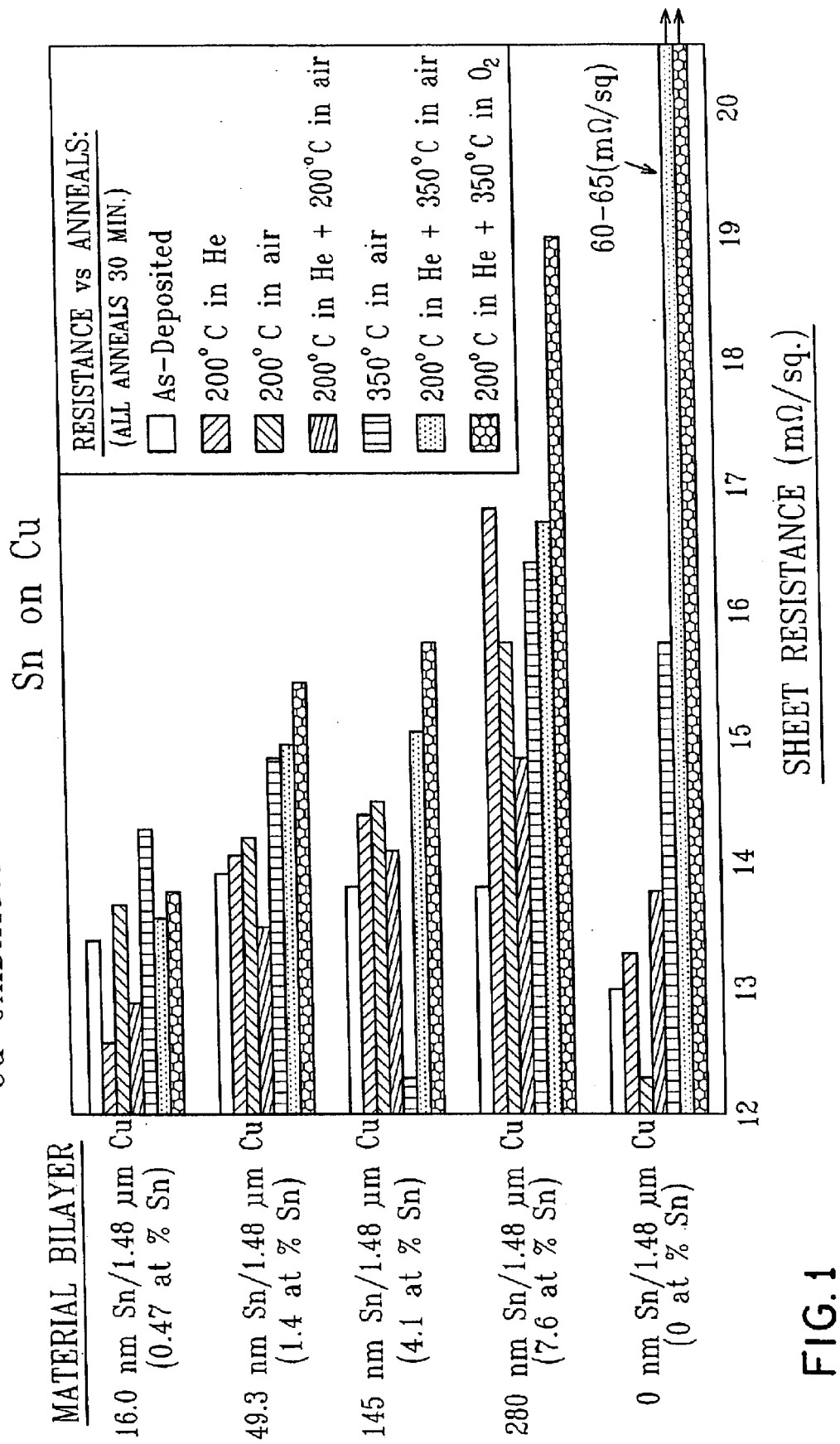
FIG. 1. Resistance of Cu capped with varying thicknesses of Sn.
Figure 2:
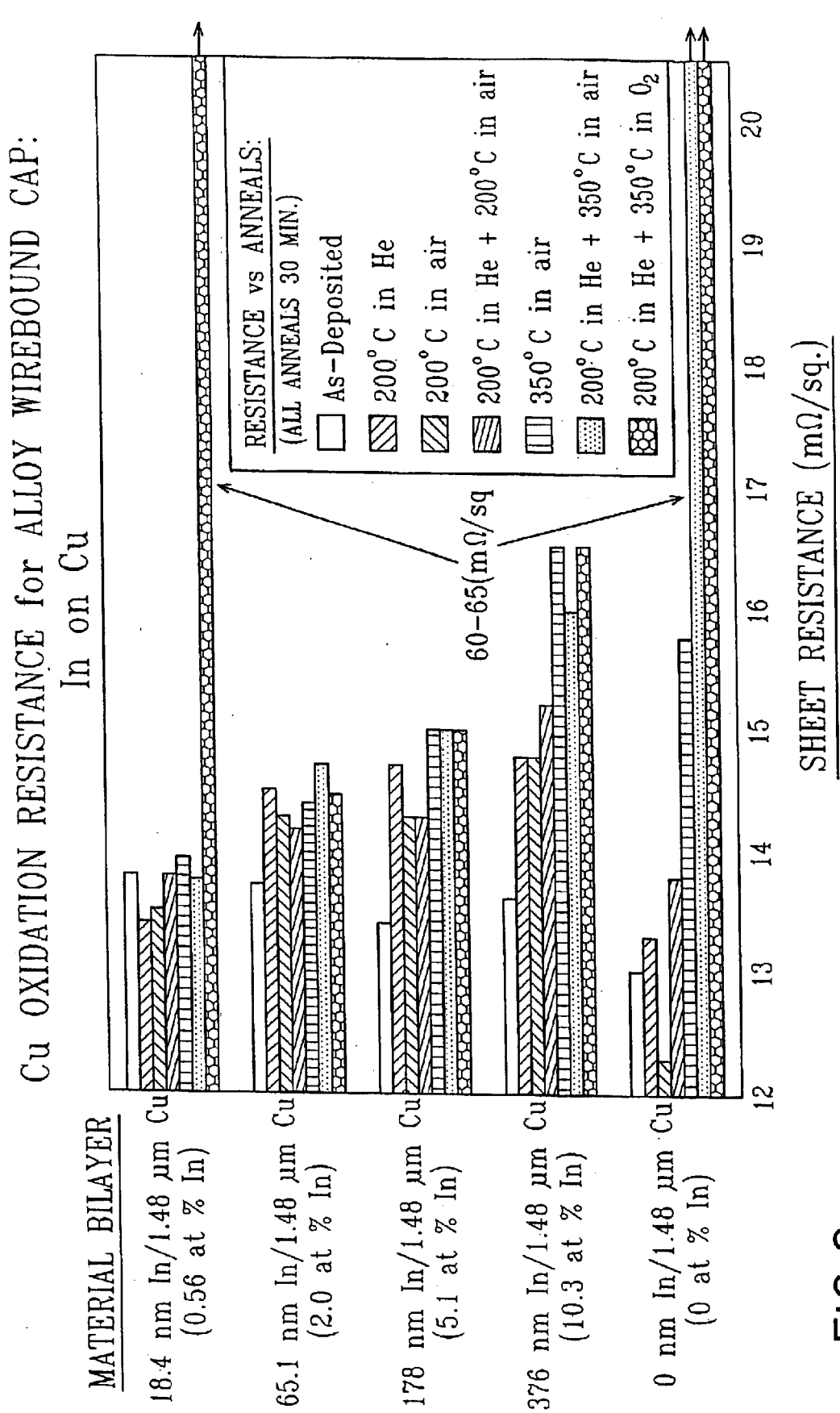
Figure 3:
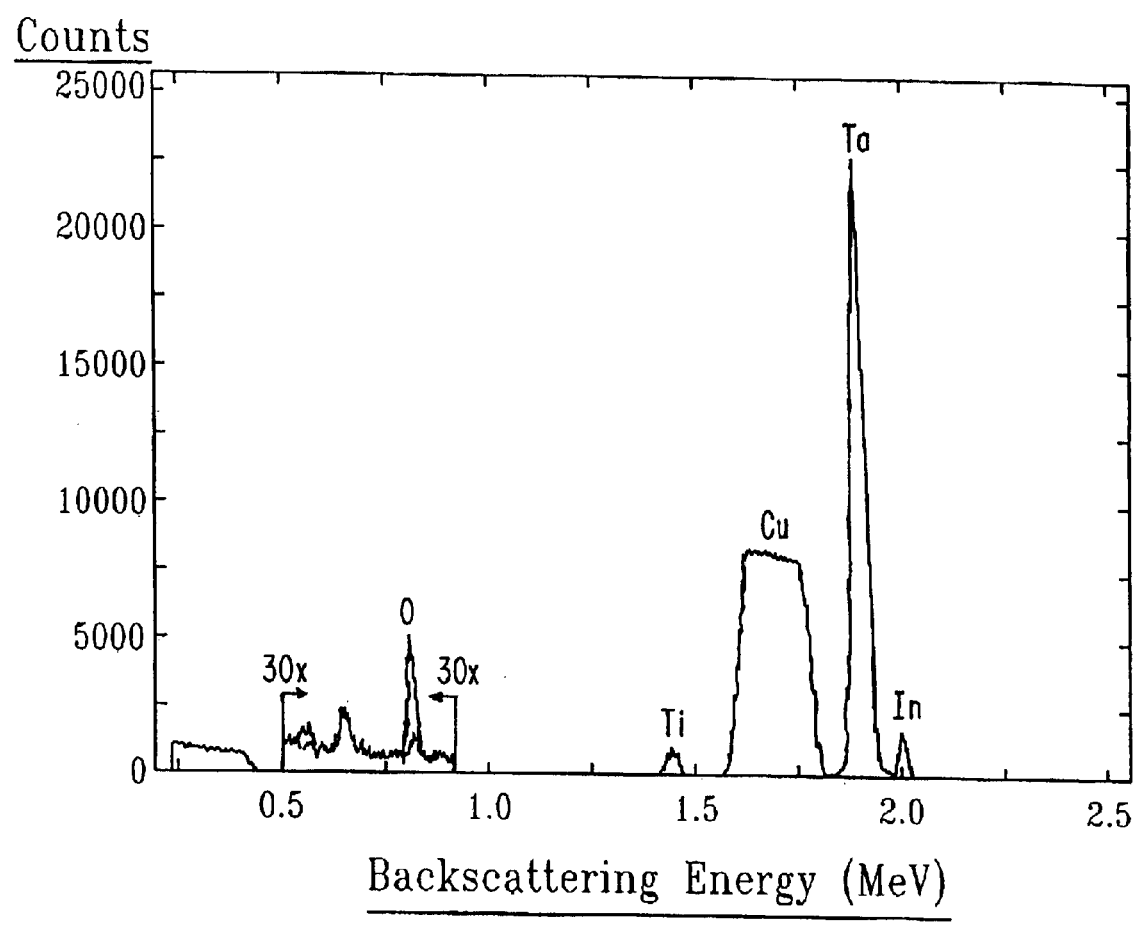
FIG. 3. RBS spectra of annealed Cu/In/O system.
Figure 4:
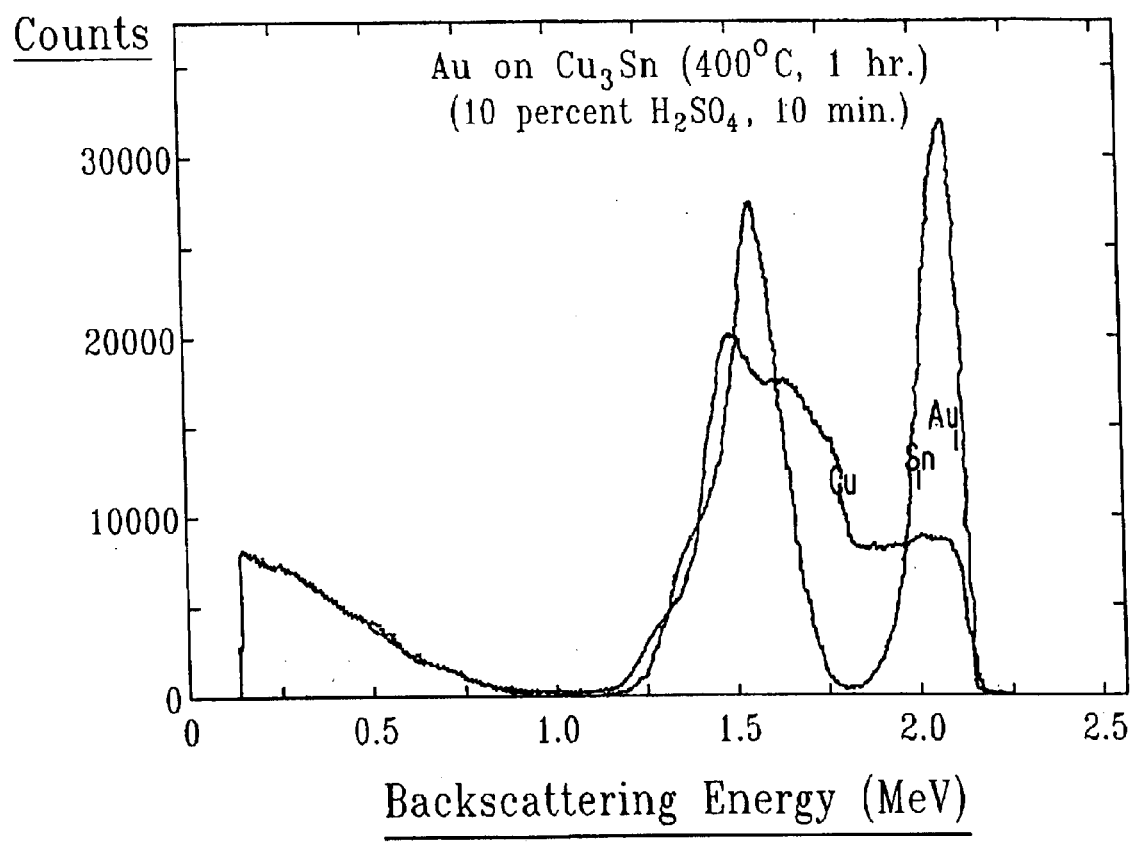
FIG. 4. RBS spectra of annealed Cu/Sn/Au system.
Figure 5:
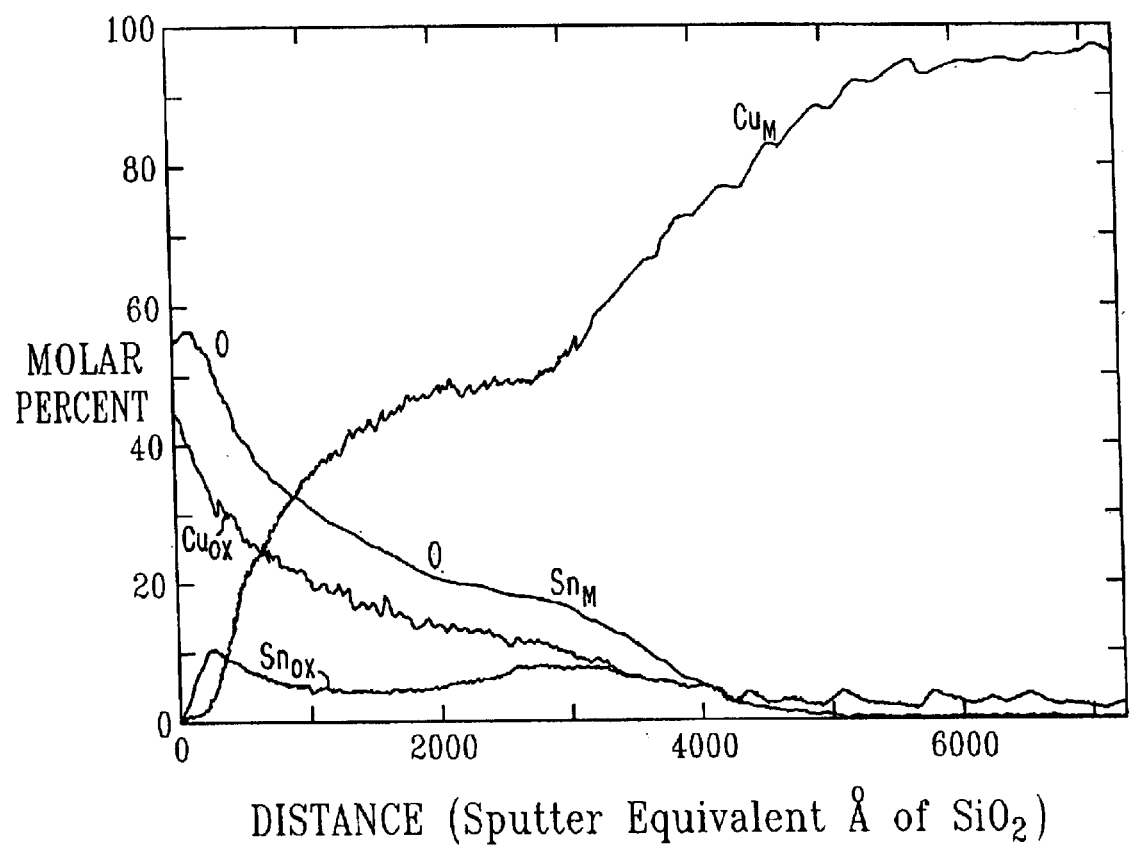
FIG. 5. Auger spectra of annealed Cu/Sn/O system.
Figure 6:
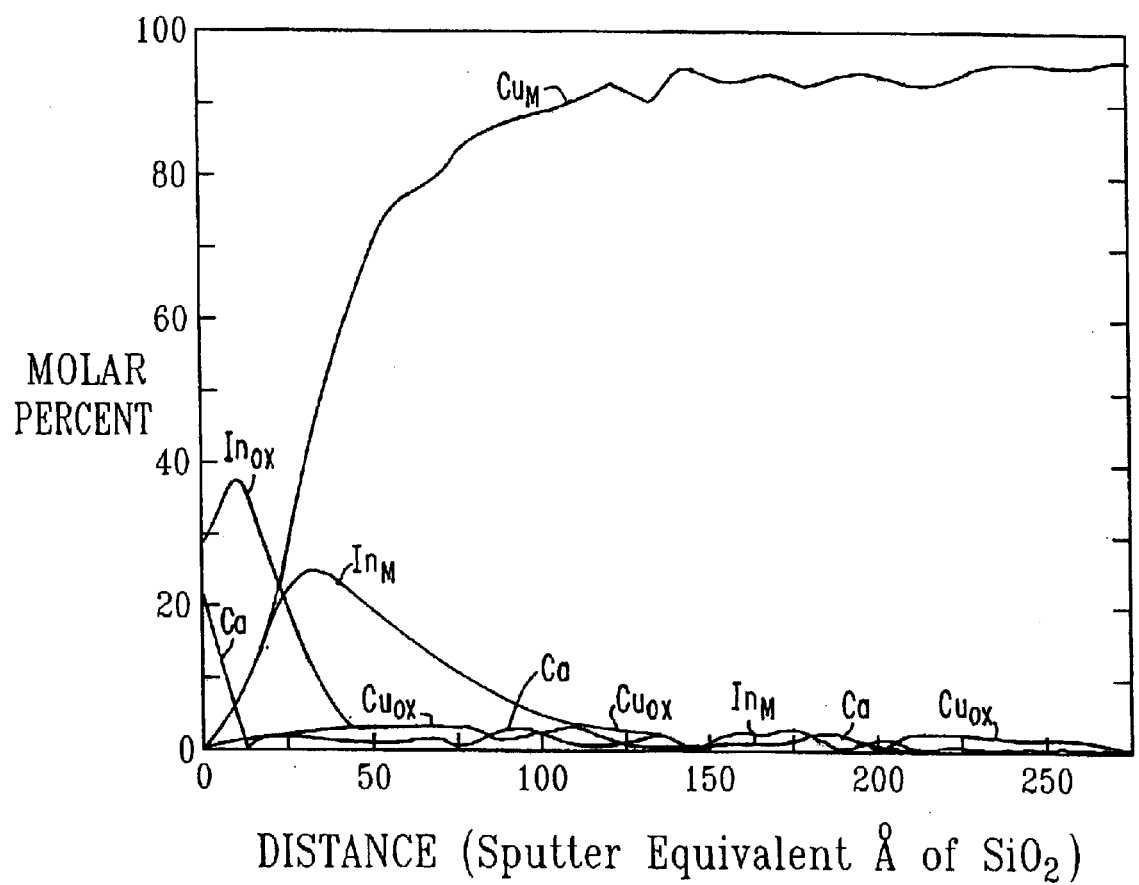
FIG. 6. Auger spectra of annealed Cu/In system.

In an embodiment of the invention the plating time is controlled such that the film thickness is from 300 Å to about 800 Å. The deposited film is subsequently alloyed and oxidized, either in a single step by annealing in an oxidizing ambient at a temperature of at least 200° C., or as separate steps of alloy formation by annealing in either an inert or reducing ambient at a temperature of at least 200° C., followed by oxide formation by annealing in an oxidizing ambient at a temperature of at least 200° C. FIG. 1 shows the resistance of copper to oxidation following capping with an Sn alloy. In embodiments for general interconnect purposes, where process temperature at or exceeding 400° C. are routinely employed, the In alloy and oxide system is preferred. FIG. 2 shows the resistance of copper to oxidation following capping with an In alloy. The Cu—In system is stable against diffusion of Cu to the surface even after several anneals at 400° C. as shown in FIG. 6. Moreover RBS studies shown in FIG. 3 indicate that a thin (4 nanometer) layer of In suffices to limit oxidation of the underlying Cu. Passivation occurs by formation of $In_2O_3$ that acts as a diffusion barrier to $O_2$. Resistivity measurements for Cu capped with different thicknesses of In and exposed to anneals in inert or oxidizing ambients indicate that $In_2O_3$ also is a good Cu diffusion barrier, and prevents formation of $Cu_3Si$ where In is deposited between Cu and Si layers.

For packaging and chip-package interfaces where temperatures at or below 300° C. are employed the Sn alloy and oxide system may be preferred.

Figure 8:
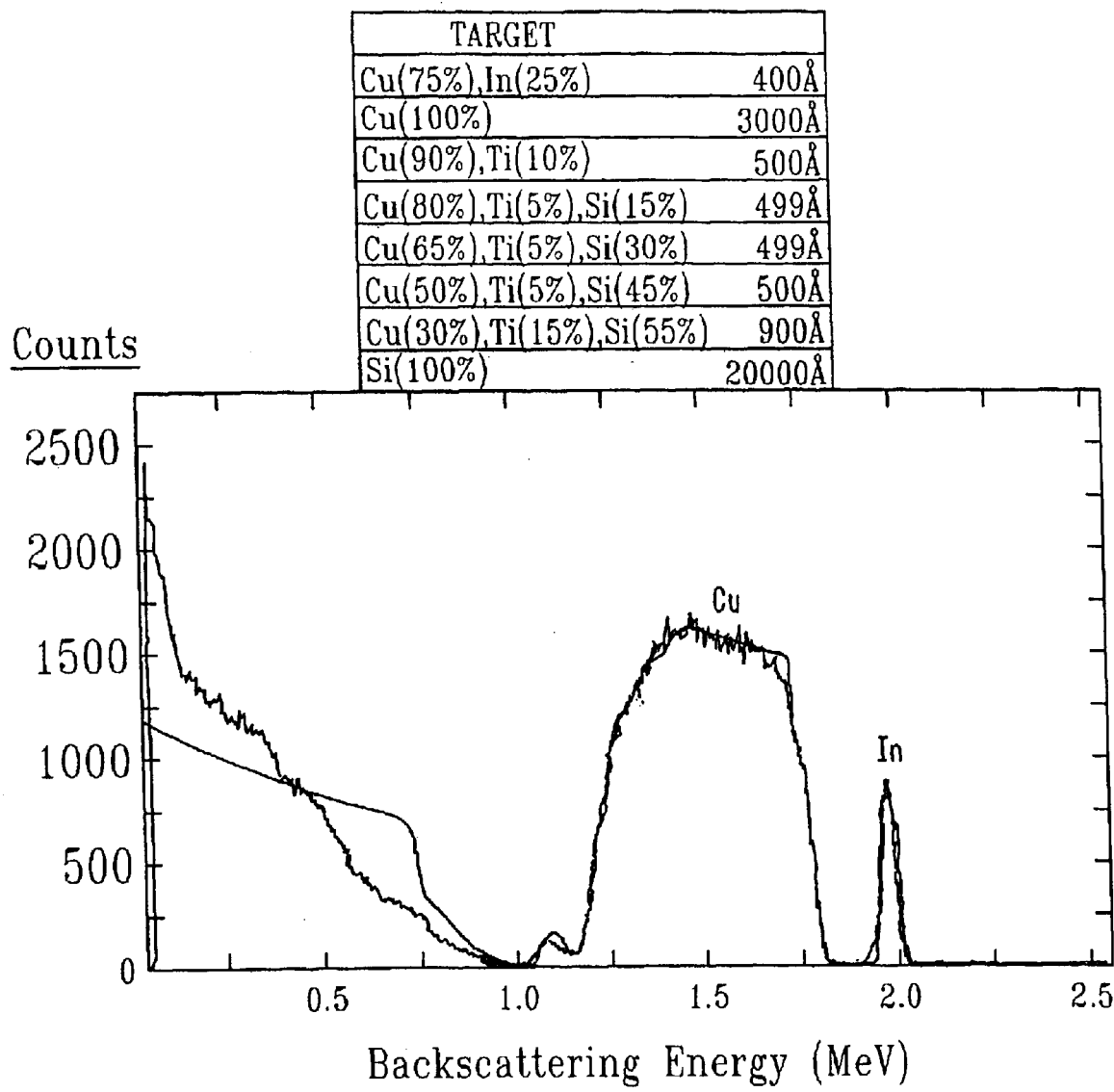
FIG. 8. RBS spectra of indium deposited onto Cu films.
Figure 9:
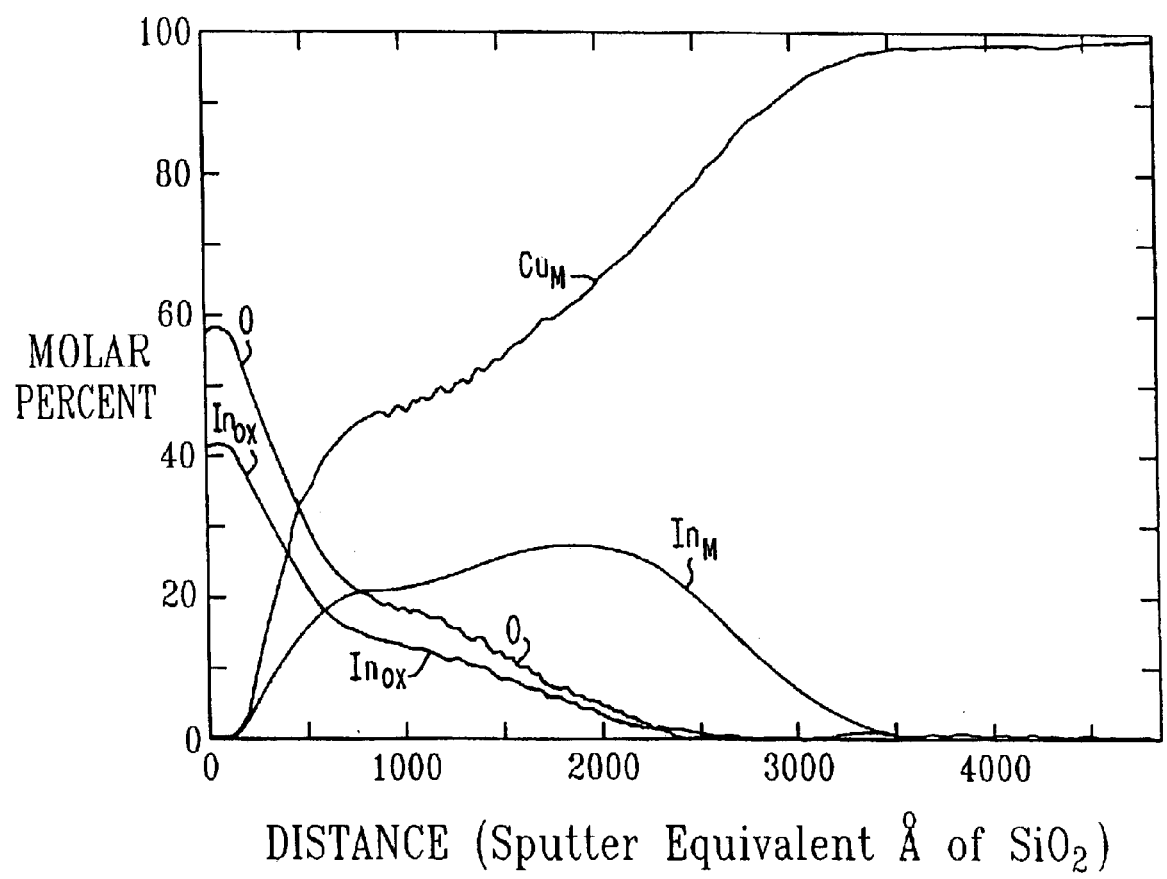
FIG. 9. Auger spectra of annealed Cu/In/O system.
Figure 10:
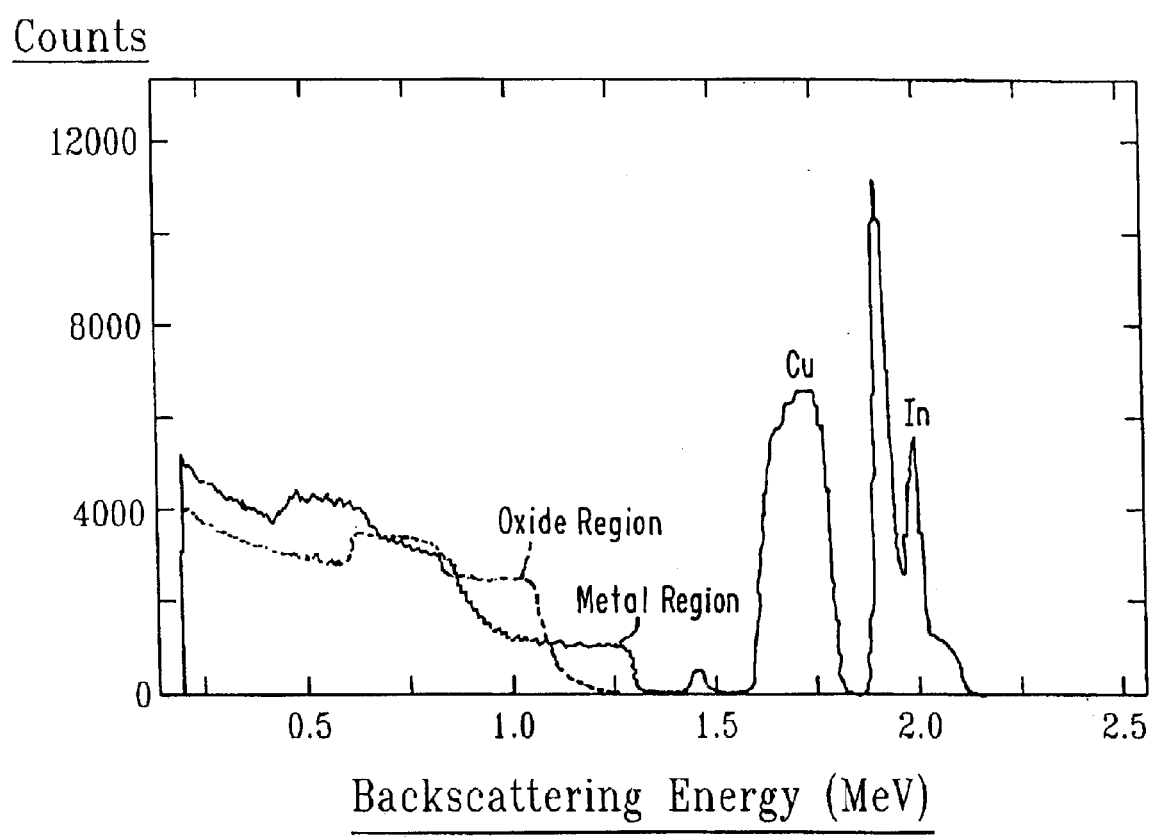
FIG. 10. RBS spectra of indium selectively deposited on patterned $Cu/SiO_2$ surfaces.

The invention provides effective means for selectively depositing a layer of In during the IC fabrication process. FIGS. 8 and 9 are Rutherford Backscatter Spectrographic (RBS) analysis of In deposited on respectively 150 nanometer and 300 nanometer Cu films indicating a composition approximately 25% In and 75% Cu. Where patterned structures of Cu were formed on $SiO_2$ as in FIG. 10, RBS shows In to be deposited only on the Cu lines, and In is not detected on $SiO_2$ surfaces.

The new terminal wire bond on Cu interconnects metallurgies provide yet another embodiment of the invention. Au is necessary to prevent native Sn oxides from preventing good wire bonding by thermal/ultrasonic or wedge-bonding techniques. According to one aspect of the invention, Cu BEOL is provided a protective Cu—Sn—Au layer to increase probe damage resistance, oxidation resistance and to act as a Cu diffusion barrier. Accordingly, the compound layer is formed by selective immersion Sn coating on Cu terminal pads, formed by the Damascene process. Selective immersion Sn baths for plating Cu are commercially available as are immersion and electroless-Au baths optimized and marketed for other applications. We have found these to work for the Cu—Sn system as well. In preferred embodiments the initial thickness of the Cu—Sn—Au compound layer varies from a few tens to a few thousands of angstroms.

It will, therefore, be appreciated by those skilled in the art having the benefit of this disclosure that this invention is capable of producing copper or aluminum surfaces capped with indium or tin bronzes, their oxides, and Au alloys. Although the illustrative embodiments of the invention are drawn from the semiconductor arts, the invention is not intrinsically limited to that art. Furthermore, it is to be understood that the form of the invention shown and described is to be taken as presently preferred embodiments. Various modifications and changes may be made to each and every processing step as would be obvious to a person skilled in the art having the benefit of this disclosure. It is intended that the following claims be interpreted to embrace all such modifications and changes and, accordingly, the specification and drawings are to be regarded in an illustrative rather than a restrictive sense.

What is claimed is:

1. A method to selectively cap the Cu terminal of a BEOL comprising:

providing one or more Cu BEOL terminal pads;

coating said pad with a layer of Sn by immersing in a selective immersion Sn plating bath;

forming a coating of Au on said Sn layer; and annealing said Au and said Sn layers.

2. A method to selectively cap the Cu terminal of a BEOL, according to claim 1, wherein forming a coating of Au comprises:

immersing in an Au immersion plating bath.

3. A method to selectively cap the Cu terminal of a BEOL, according to claim 1, wherein forming a coating of Au comprises:

immersing in an Au electroless plating bath.

4. A method to selectively cap the Cu terminal of a BEOL, according to claim 1, wherein annealing comprises heating in an oxidizing ambient.

5. A method to selectively cap the Cu terminal of a BEOL, according to claim 1, wherein said one or more Cu BEOL terminal pads are provided by the Damascene process.

6. A method to selectively cap the Cu terminal of a BEOL, according to claim 1, wherein said one or more Cu BEOL terminal pads are provided by the dual Damascene process.

7. A method to selectively cap the Cu terminal of a BEOL, according to claim 1, wherein said Sn plating bath comprises stannous chloride.

8. A method to selectively cap the Cu terminal of a BEOL, according to claim 7, wherein said Sn plating bath further comprises water, sulfuric acid, hypophosphite and thiourea.

9. A method to selectively cap the Cu terminal of a BEOL, according to claim 1 wherein said annealing said layers includes elevated temperatures at or below 300° C.

10. A method to selectively cap the Cu terminal of a BEOL, according to claim 1, wherein said annealing said layers provides a capping layer with a thickness from a few tens to a few thousands of Angstroms.

* * * * *